United States Patent [19]

Keil

[11] Patent Number: 4,785,462
[45] Date of Patent: Nov. 15, 1988

[54] DYNAMICALLY ONE-MODE SEMICONDUCTOR LASER

[75] Inventor: Rudolf Keil, Munich, Fed. Rep. of Germany

[73] Assignee: Siemens Aktiengesellschaft, Berlin and Munich, Fed. Rep. of Germany

[21] Appl. No.: 898,145

[22] Filed: Aug. 18, 1986

[30] Foreign Application Priority Data

Sep. 18, 1985 [DE] Fed. Rep. of Germany ....... 3533296

[51] Int. Cl.$^4$ .......................... H01S 3/08; G02B 6/12
[52] U.S. Cl. .................................. 372/92; 350/96.12; 350/96.18; 372/98; 372/99; 372/107; 372/19
[58] Field of Search ..................... 372/92, 99, 98, 19, 372/32, 107, 108; 350/96.11, 96.12, 96.15, 96.18, 96.20

[56] References Cited

FOREIGN PATENT DOCUMENTS 0088888  5/1984  Japan ..................................... 372/92

OTHER PUBLICATIONS

K. Utaka et al., "Room–Temperature CW Operation of Distributed–Feedback . . . " Electronics Letters, v. 17 #25, 10/12/81 pp. 961–963.

Y. Abe et al. "Room–Temperature CW Operation of 1.60 μm . . . " Electronics Letters, v. 18 #10, (May 13, 1982) pp. 410–411.

W. T. Tsang et al. "1.5 μm Wavelength GaInAsP C$^3$ Lasers: . . . " Electronics Letters, v. 19 #11, (May 26, 1983) pp. 415–417.

Kappeler et al. "High cw power arrays of optically coupled . . . " Ninth IEEE Intl. Semicon. Laser Conf. Rio, (Aug. 1984) pp. 90–91.

C. Voumard et al. "Single–Mode Operation of Diode Lasers . . . " Optics Communications, v 13 #2, (Feb. 1975) pp. 130–132.

K. Y. Liou et al. "Single–Longitudinal-mode operation . . . " Optical Fiber Comm. (Jan. 1984) pp. 64–66.

Figueroa et al., "Studies of (GaAl) As Injection Lasers Operating with An Optical Fiber Resonator," J. Appl. Phys., 51(6), Jun. 1980, pp. 3062–3071.

Primary Examiner—William L. Sikes
Assistant Examiner—Georgia Y. Epps

[57] ABSTRACT

A dynamically one-mode semiconductor laser having a laser diode with a coupled external resonator includes a resonator mirror disposed opposite a light emitting face of the laser diode and a collimation optics between the diode and the resonator mirror. The collimation optics includes a refractive hemispherical micro-lens having flat side applied to the resonator mirror which is manufactured by fusing a small drop of glass onto the resonator mirror.

9 Claims, 1 Drawing Sheet

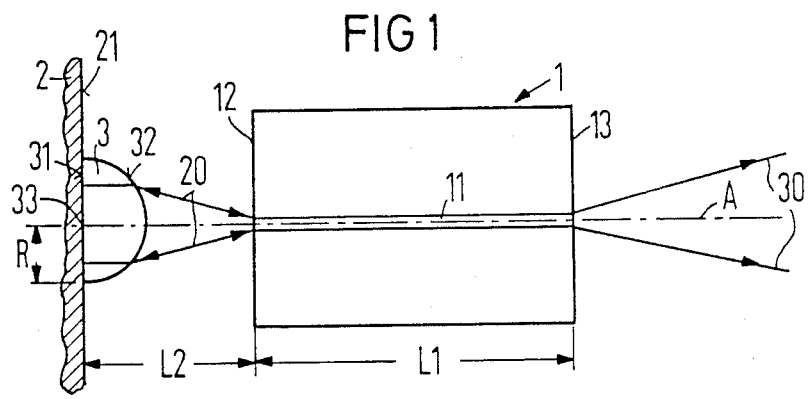
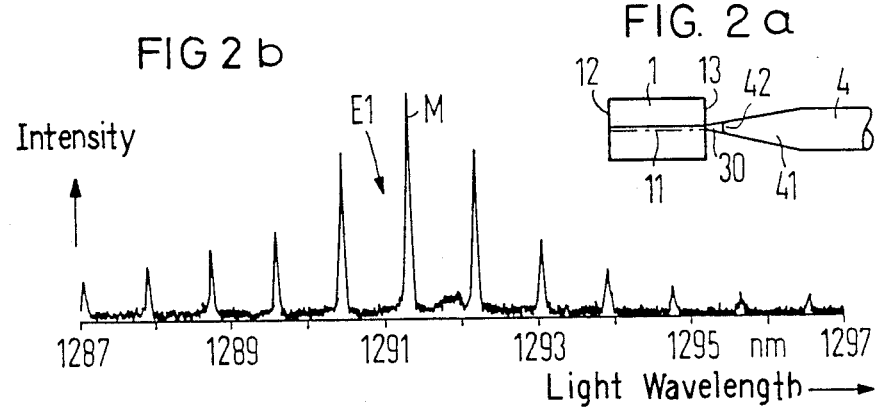
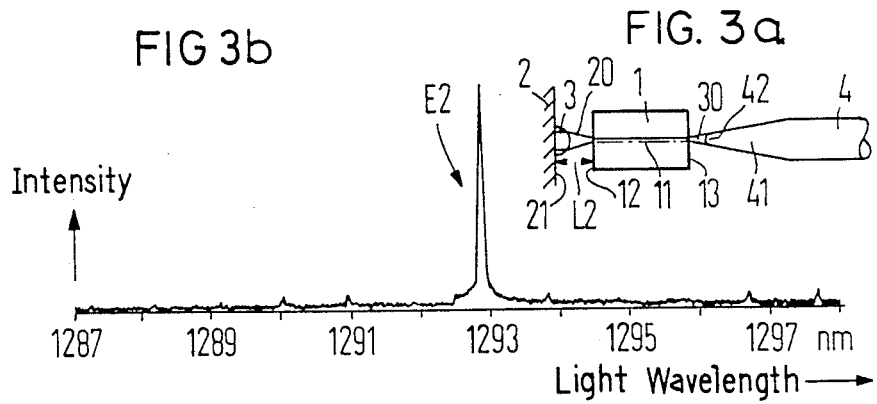

DYNAMICALLY ONE-MODE SEMICONDUCTOR LASER

BACKGROUND OF THE INVENTION

1. Field of the Invention

The present invention relates to a semiconductor laser having an externally coupled resonator with collimation optics between the laser diode and the resonator.

2. Description of the Prior Art

Semiconductor lasers which have an emission spectrum of only one longitudinal mode are required for use in optical broadband transmission. Although presently available diodes are in many instances one-mode, or single-mode, during CW operation for unchopped radiation, the known laser diodes operate in a multi-mode fashion when coupled to an optical fiber or when modulated.

Dynamically single-mode semiconductor lasers, defined herein as semiconductor lasers which remain in a one-mode operation even when coupled to an optical fiber or when modulated, can be formed of DFB (distributed-feedback) lasers, with DBR (distributed-Bragg-reflector) lasers, of $C^3$ lasers, or of coupled laser arrays. See the following references for examples:

1. Utaka, K., Akiba S., Sakai, K. and Matsushima, Y., "Room-temperature CW operation of distributed-feedback buried-heterostructure InGaAsP/InP lasers emitting at 1.57 μm", *Electron. Lett.* 17 (1981), pages 961 through 963.
2. Abe, Y., Kishino, K., Tanbum-Ek, T., Aral, S., Koyama, F., Matsumoto, K., Watanabe, T., and Suematsu, Y., "Room-temperature CW operation of 1.60 μm GaInAsP/InP buried heterostructure integrated laser with butt-jointed-built-in distributed-Bragg-reflection waveguide", *Electron. Lett.* 18 (1982), pages 410–411.
3. Tsang, W. T., Wolsson, N. A., Linke, R. A., Logan R. A., "1.5 μm wavelength GaInAsP-$C^3$ lasers single-frequency operation and wideband frequency tuning", *Electron. Lett.* 19 (1983), pages 415–417.
4. Kappeler, F., Westermeier, H., Gessner, R., Druminski, M., Zschauer, K. H., "High CW power arrays of optically coupled (Ga,Al)As oxide stripe lasers with dc-to-light conversion efficiencies of up to 36%", *9th IEEE Int. Semicond. Laser Conf.*, August 1984, Rio de Janeiro.

Each of the lasers disclosed in the above-listed references, however, are very difficult to achieve technologically. For example, DBR lasers or DFB lasers have extremely critical format tolerances and $C^3$ lasers must be provided with the required stability. For laser arrays, a plurality of lasers must be operated in parallel to achieve a DSM (dynamically single-mode) laser. Such operation, however, requires high power consumption and, as a result, heat dissipation becomes critical.

A further possibility for achieving dynamically single-mode semiconductor lasers is to couple an external resonator to a one-mode laser diode, such as a conventional BH laser diode. A dynamically one-mode semiconductor laser is known from Liou, U. Y., Granlund, S. W., Swan, C. B., "Single-longitudinalmode operation of GRIN external coupled-cavity semiconductor lasers", *Opt. Fiber Comm.*, January 1984, New Orleans. The disclosed embodiment of the laser corresponds to a dynamically one-mode semiconductor laser of the species initially cited. To form such a laser, collimator optics are used, formed of a section of gradient fiber having a quarter pitch length. The end face facing the light exit face of the laser diode is antireflective so that the mirrored opposite end face forms an external resonator with the laser mirror. The effective resonator length is defined by the fiber perimeters and more specifically, by the numerical aperture and fiber radius, and can be changed to only a limited degree by a variation of the fiber length.

Very short resonators which can be required in some instances have a length of between 100 μm and 200 μm which cannot be produced with normally obtainalle fiber perimeters or are very difficult to manufacture therewith. In the reference Voumard, C., Salathe, R., and Weber, I., "Single-mode operation of diode lasers coupled to hemispherical resonators", *Opt. Commum.* 13 (1975), pages 130–132 is disclosed a dynamically single-mode semiconductor laser in the form of a laser having a coupled external resonator in the form of a spherical concave mirror. The radius of the mirror is in a range of between 50 μm and 200 μm. The manufacture of such small mirror radii of adequate quality and precision is extremely difficult.

SUMMARY OF THE PRESENT INVENTION

An object of the present invention is to provide a dynamically single-mode semiconductor laser with the desired resonator length which is relatively simple to manufacture. This and other objects are achieved with a semiconductor laser in which an external resonator includes collimation optics having a refracting hemispherical micro-lens, the flat side of which is applied to a resonator mirror.

It is thus possible with the present invention to vary the resonator length within the desired range during manufacture in a simple and easily reproducible way. Furthermore, no mirroring or multiple antireflective layers are required in the collimation optics of the present invention. This occurs from the fact that the reflection of the arced surface of the micro-lens facing the light emitting face of the laser diode is relatively poorly matched to the laser mode due to its great curvature, as a result of which only a slight disturbance is to be expected therefrom. When required, the slight disturbance can be greatly reduced by a single coating on the arced surface of the lens.

In the preferred embodiment of the present laser diode, the resonator mirror of the external resonator is formed of a flattened wire and the micro-lens affixed thereto is formed of a highly refractive heavy flint glass. The resonator mirror and micro-lens are preferably formed of materials having essentially coincident coefficients of temperature expansion since the lens is manufactured by fusing. A good adhesion of the glass lens to the lens carrier is thereby achieved.

Particularly good performance of the present invention is achieved when the resonator mirror is of platinum-rhodium and the lens is formed of lanthanum heavy flint glass. The lanthanum heavy flint glass has the advantages of not only a high refractive index but also a low melting temperature of between 550° to 600° C. The coefficient of temperature expansion of lanthanum glass is $86 \times 10^{-7} K^{-1}$, which agrees well with the coefficient of thermal expansion for platinum-rhodium which is $92.7 \times 10^{-7} K^{-1}$. A good adhesion between the glass lens and the lens carrier is thereby achieved.

The mirror properties of the resonator mirror formed of platinum-rhodium is not deteriorated by the fusing of the glass at temperatures of 600° C.

The manufacture of the present resonator mirror in the form of an applied refractive hemispherical micro-lens for a semiconductor laser includes fusing a small drop of glass onto a resonator mirror. The surface tension of the drop of glass causes the glass droplet to assume a nearly hemispherical shape. To mount the glass droplet on the mirror, molten glass is picked up by a heated wire tip and applied to the resonator mirror. The quantity of glass and, thus, the resulting lens radius is easily controlled by the shape and the temperature of the wire tip.

BRIEF DESCRIPTION OF THE DRAWINGS

FIG. 1 is a schematic longitudinal cross-section of a dynamically single-mode semiconductor laser in the form of a laser diode having a coupled external resonator according to the principles of the present invention;

FIG. 2a is a schematic diagram of a CSP laser diode coupled to a fiber;

FIG. 2b is a graph of the emission spectra of the laser diode of FIG. 2a;

FIG. 3a is a schematic diagram of a CSP laser diode coupled to a fiber and having an external resonator according to the principles of the present invention; and FIG. 3b is a graph of the emission spectra of the laser diode of FIG. 3a.

DETAILED DESCRIPTION OF THE PREFERRED EMBODIMENTS

In FIG. 1, a single-mode laser diode is referenced 1 wherein the laser diode operates in single-mode fashion for unchopped radiation. The laser diode 1 has an optical axis A and a light emitting laser active zone 11 extending along the axis A. The diode 1 has light exits or emitting faces 12 and 13 from which the laser ligh emerges in the region of the laser active zone 11 so as to form divergent rays 20 and 30 in both directions of the optical axis A. The light emitting faces 12 and 13 are disposed essentially perpendicular to the axis A and define the length $L_1$ of the laser diode 1. Opposite the one light emitting face 12 is a resonator mirror 2 at a distance $L_2$ therefrom. The resonator mirror 2 has a mirror surface 21 facing the light emitting face 12 and is disposed essentially perpendicular to the optical axis A of the diode 1. A refractive, hemispherical micro-lens 3 having a flat side 31 is applied to the mirror surface 21 so that a convexly arced surface 32 is directed toward the light emitting face 12 of the laser diode 1. The micro-lens 3 is preferably disposed so that the center 33 of curvature of the arced surface 32 is at least approximately on the optical axis A.

As is known both theoretically and experimentally, the best side mode suppression is achieved when the diode length $L_1$ has a ratio to the external resonator length $L_2$ of $L_1/L_2 = 3/5$. The optical length $L_2$ of the external resonator may be established by the following equation:

$$L_2 = n_L \cdot R_L + \frac{R_L(1 - n_L/2)}{n_L - 1} + \sqrt{\left[\frac{n_L \cdot R_L}{2(n_L - 1)}\right]^2 - \left[\frac{\pi \cdot w_L^2}{\lambda_0}\right]^2},$$

where $R_L$ is the radius of the lens that corresponds to the curvature radius of the convexly arced lens face 32, $n_L$ is the refractive index of the lens, and $\lambda_0$ is the vacuum wavelength of the laser light. $w_L$ is the mean spot width of laser beam 20 at the light emitting face 12. The mean spot width $w_L$ is defined by where $\sqrt{w_{11} \cdot w_1}$ where $w_{11}$ and $w_1$ denote two diameters of the laser spot measured perpendicular to one another.

By way of example, the illustrated semiconductor laser has a micro-lens 3 of highly refractive heavy flint glass having a refractive index $n_L = 1.82$ and a long-wave wavelength from an InGaAs laser diode $\lambda_0 = 1.3$ $\mu$m. The mean spot width $w_L$ is approximately 1 $\mu$m and the diode length $L_1 = 200$ $\mu$m. Then, for a $L_1/L_2$ ratio of 3/5, a lens radius $R_L$ of 40-60 $\mu$m results.

In manufacturing the illustrated semiconductor laser, a platinum-rhodium wire is pressed flat for use as a resonator mirror 2. A small drop of lanthanum heavy flint glass LaSF9 is fused onto the wire. The surface tension of the glass drop causes the droplet to assume a nearly hemispherical shape. The glass drop is picked up by a heated platinum-rhodium wire tip and is applied to the lens carrier. It is possible to carefully control the quantity of the glass and, thus, the lens radius by the shape and temperature of the wire tip.

A dynamically single-mode semiconductor laser is formed from the above-described structure by using a one-mode 1.3 $\mu$m CSP laser diode, the spectrum thereof being measured through a coupled mono-mode fiber with a taper and fused lens as shown in FIG. 3a.

For purposes of comparison, the spectrum of a known laser diode is also measured having only a mono-mode fiber with an optimal fiber taper, as shown in FIG. 2a. The emission spectrum which results from the laser diode of FIG. 2a is shown in FIG. 2b. In FIG. 2a, a CSP laser diode 1 is coupled to a mono-mode fiber 4, a laser beam 30 emerges from a light exit, or emitting, face 13 and is coupled into the fiber 4 by a fused lens 42 at a taper 41.

The laser emission spectrum shown in FIG. 2b and denoted generally $E_1$ is obtained from the laser diode of FIG. 2a. In addition to a central mode M in the form of a large spike, numerous side modes are also present and clearly recognizable as relatively lower spikes.

The present dynamically single-mode semiconductor laser is shown connected for testing in FIG. 3a, with the emission spectrum thereof being shown in FIG. 3b. The laser of the present invention is formed by coupling an external resonator having a resonator mirror 2 and a refractive hemispherical micro-lens 3 affixed thereto. A lens radius $R_L$ of 54 $\mu$m and an optical resonator length of $L_2 = 100-150$ $\mu$m is used. An emission spectrum $E_2$ is shown in FIG. 3b as obtained from the illustrated laser of FIG. 3a which is a nearly single-mode spectrum.

Although modifications and changes may be suggested by those skilled in the art, it is the intention of the inventor to embody within the patent warranted hereon all changes and modifications as reasonably and properly come within the scope of his contribution to the art.

I claim as my invention:

1. A dynamically one-mode semiconductor laser including a laser diode, comprising:
    a coupled external resonator having a resonator mirror disposed opposite a light emitting face of said laser diode; and
    collimation optics disposed between said laser diode and said resonator mirror, said collimation optics including a refractive hemispherical micro-lens, a flat side of said hemispherical micro-lens being directly applied to a mirror surface of said resonator mirror.

2. A dynamically one-mode semiconductor laser as claimed in claim 1, wherein said micro-lens has an arced surface facing said light emitting face of said laser diode and said arced surface includes a single antireflex coating.

3. A dynamically one-mode semiconductor laser as claimed in claim 1, wherein said resonator mirror is made of a flattened wire.

4. A dynamically one-mode semiconductor laser as claimed in claim 1, wherein said micro-lens is formed of highly refractive heavy flint glass.

5. A dynamically one-mode semiconductor laser as claimed in claim 1 wherein said resonator mirror and said micro-lens are formed of materials having essentially coincident coefficients of temperature expansion.

6. A dynamically one-mode semiconductor laser as claimed in claim 5 wherein said resonator mirror is of platinum-rhodium, and wherein said micro-lens is formed of lanthanum heavy flint glass.

7. A dynamically single-mode semiconductor laser, comprising:
a laser diode having a laser active region along an axis and opposing emitting faces substantially perpendicular to said axis;
an external resonator disposed spaced from a first of said emitting faces, said external resonator including a mirror substantially perpendicular to said axis; and
a collimation optic member in the form of a hemispherical lens mounted directly on said mirror facing said first emitting face of said laser diode, a radius of curvature of said hemispherical lens being substantially coincident with said axis.

8. A dynamically single-mode semiconductor laser as claimed in claim 7, wherein said laser diode has a length $L_1$ between said opposing emitting faces, and
wherein said external resonator is spaced from said first emitting face by a distance $L_2$ and the equation $$\frac{L_1}{L_2} = \frac{3}{5}$$

is satisfied.

9. A dynamically single-mode semiconductor laser as claimed in claim 7, wherein said external resonator is spaced from said emitting face by a distance $L_2$, for $$L_2 = n_L \cdot R_L + \frac{R_L(1 - n_L/2)}{n_L - 1} + \sqrt{\left[\frac{n_L \cdot R_L}{2(n_L - 1)}\right]^2 - \left[\frac{\pi \cdot w_L^2}{\lambda_0}\right]^2},$$

where $R_L$ is the radius of said hemispherical lens, $n_L$ is the refractive index of said lens material, $\lambda_0$ is the wavelength of the laser light and $w_L$ is the mean spot width of the laser beam.

* * * * *